(12) United States Patent
Kawaguchi (10) Patent No.: US 10,888,961 B2
(45) Date of Patent: Jan. 12, 2021

(54) JOINING MATERIAL AND METHOD FOR MANUFACTURING JOINED BODY

(71) Applicant: Murata Manufacturing Co., Ltd., Nagaokakyo (JP)

(72) Inventor: Yoshihiro Kawaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 35 days.

(21) Appl. No.: 16/123,109

(22) Filed: Sep. 6, 2018

(65) Prior Publication Data

US 2019/0001444 A1 Jan. 3, 2019

Related U.S. Application Data

(63) Continuation of application No. PCT/JP2017/000472, filed on Jan. 10, 2017.

(30) Foreign Application Priority Data

Mar. 7, 2016 (JP) .................................. 2016-043556

(51) Int. Cl.
*B23K 35/26* (2006.01)
*C22C 9/06* (2006.01)
(Continued)

(52) U.S. Cl.
CPC .......... *B23K 35/262* (2013.01); *B22F 1/0014* (2013.01); *B22F 7/064* (2013.01);
(Continued)

(58) Field of Classification Search
CPC ................................. B23K 35/262; C22C 9/06
(Continued)

(56) References Cited

U.S. PATENT DOCUMENTS

| 10,050,355 B2 * | 8/2018 | Nakano ..................... C22C 9/02 |
| 2002/0100986 A1 | 8/2002 | Soga et al. |
| 2013/0233618 A1 * | 9/2013 | Nakano ................ B23K 35/025 174/94 R |

FOREIGN PATENT DOCUMENTS

| JP | H1177366 A | 3/1999 |
| JP | 2002254194 A | 9/2002 |

(Continued)

OTHER PUBLICATIONS

International Search Report issued for PCT/JP2017/000472, dated Apr. 18, 2017.
(Continued)

*Primary Examiner* — Weiping Zhu
(74) *Attorney, Agent, or Firm* — Arent Fox LLP (57) ABSTRACT

The joining material of the present invention is a joining material which contains a first metal powder and a second metal powder having a higher melting point than the first metal powder, in which the first metal powder is formed of Sn or an alloy containing Sn, the second metal powder is formed of a Cu—Ni alloy in which a proportion of Ni is 5 wt % or more and 30 wt % or less, a Cu—Ni—Co alloy in which a total of a proportion of Ni and a proportion of Co is 5 wt % or more and 30 wt % or less, or a Cu—Ni—Fe alloy in which a total of a proportion of Ni and a proportion of Fe is 5 wt % or more and 30 wt % or less, and a 90% volume grain size D90 of the second metal powder is 0.1 μm or more.

14 Claims, 2 Drawing Sheets

(51) Int. Cl.
    *C22C 13/00*     (2006.01)
    *B23K 35/22*     (2006.01)
    *C22C 13/02*     (2006.01)
    *H05K 3/34*     (2006.01)
    *B23K 35/02*     (2006.01)
    *B22F 7/06*     (2006.01)
    *C22C 1/04*     (2006.01)
    *B22F 1/00*     (2006.01)
    *B23K 35/30*     (2006.01)
    *C22C 9/00*     (2006.01)
    *C22C 12/00*     (2006.01)
    *B23K 103/18*     (2006.01)
    *B23K 103/12*     (2006.01)
    *B23K 101/36*     (2006.01)

(52) U.S. Cl.
CPC .......... *B23K 35/0244* (2013.01); *B23K 35/22* (2013.01); *B23K 35/26* (2013.01); *B23K 35/302* (2013.01); *C22C 1/0483* (2013.01); *C22C 9/06* (2013.01); *C22C 13/00* (2013.01); *C22C 13/02* (2013.01); *H05K 3/3457* (2013.01); *B22F 2301/30* (2013.01); *B22F 2301/40* (2013.01); *B22F 2999/00* (2013.01); *B23K 2101/36* (2018.08); *B23K 2103/12* (2018.08); *B23K 2103/18* (2018.08); *C22C 9/00* (2013.01); *C22C 12/00* (2013.01); *H05K 2201/0272* (2013.01)

(58) Field of Classification Search
USPC .......................................................... 148/24
See application file for complete search history.

(56) References Cited

FOREIGN PATENT DOCUMENTS

| | | |
|---|---|---|
| JP | 2006241549 A | 9/2006 |
| JP | 2012176433 A | 9/2012 |
| JP | 2015188902 A | 11/2015 |

OTHER PUBLICATIONS

Written Opinion of the International Searching Authority issued for PCT/JP2017/000472, dated Apr. 18, 2017.

* cited by examiner

JOINING MATERIAL AND METHOD FOR MANUFACTURING JOINED BODY

CROSS REFERENCE TO RELATED APPLICATIONS

The present application is a continuation of International application No. PCT/JP2017/000472, filed Jan. 10, 2017, which claims priority to Japanese Patent Application No. 2016-043556, filed Mar. 7, 2016, the entire contents of each of which are incorporated herein by reference.

FIELD OF THE INVENTION

The present invention relates to a joining material and a method of manufacturing a joined body.

BACKGROUND OF THE INVENTION

As a method of mounting an electronic component on a substrate, generally, a method of soldering an electrode of an electronic component to an electrode on a substrate (a land electrode) is used.

As a solder paste to be used in such a mounting, Patent Document 1 discloses a soldering paste which contains a mixture of (a) first metal balls formed of Sn or In, (b) second metal (or alloy) balls formed of a high melting point-metal such as Cu, Al, Au, Ag, or the like, or a high melting point-alloy containing the same.

Patent Document 1 also discloses a joining method which uses the soldering paste, and a method of manufacturing an electronic device.

When conducting soldering using the soldering paste described in Patent Document 1, a low melting point-metal (e.g., Sn) balls and a high melting point-metal (e.g., Cu) balls are heated, so that the low melting point-metal and the high melting point-metal react with each other to form an intermetallic compound, and objects to be joined are joined (namely, soldered) to each other through a joining portion containing the intermetallic compound.

When such soldering material is cooled from a melted state and solidified, a crack is sometimes generated in a joined portion. Basically, a crack propagates along a grain boundary of crystal grains having a low melting point-metal such as Sn, and therefore, the larger the crystal grains of Sn or the like are after the solidification, the easier a crack propagates.

Thus, for example, Patent Document 2 discloses a soldering material to which Ni is added. According to Patent Document 2, it is possible to prevent a propagation of a crack by micronizing crystal structure of Sn.

Patent Document 1: Japanese Patent Application Laid-Open No. 2002-254194
Patent Document 2: Japanese Patent Application Laid-Open No. H11-77366

SUMMARY OF THE INVENTION

However, even in a case where Sn or the like is added with Ni as in Patent Document 2, an effect of preventing a crack generated in a joined portion after a solidification was not sufficient, and there was therefore still room for improvement.

The present invention has been made in order to solve the problem described above, and a purpose of the present invention is to provide a joining material capable of suppressing a crack generated in a joined portion after a solidification, and a method of manufacturing a joined body in which the joining material is used.

In order to achieve the purposes, the joining material of the present invention contains a first metal powder and a second metal powder having a higher melting point than the first metal powder. The first metal powder is made of Sn or an alloy containing Sn, the second metal powder is made of a Cu—Ni alloy in which a proportion of Ni is 5 wt % or greater and 30 wt % or less, a Cu—Ni—Co alloy in which a total of a proportion of Ni and a proportion of Co is 5 wt % or greater and 30 wt % or less, or a Cu—Ni—Fe alloy in which a total of a proportion of Ni and a proportion of Fe is 5 wt % or greater and 30 wt % or less, and a 90% volume grain size D90 of the second metal powder is 0.1 μm or greater.

By using the second metal powder noted above, it is possible to suppress a crack generated in a joined portion after a solidification. Differently from Cu as a single component or Ni as a single component, a Cu—Ni alloy, a Cu—Ni—Co alloy, or a Cu—Ni—Fe alloy reacts rapidly with Sn or an alloy containing Sn by a heating at the time of joining to form an intermetallic compound containing (Cu, Ni)$_6$Sn$_5$, (Cu, Ni, Co)$_6$Sn$_5$, or (Cu, Ni, Fe)$_6$Sn$_5$. It is considered that this intermetallic compound disperses in a joining material to suppress an enlargement of Sn crystal grain or the like, and as a result, a crack is suppressed.

In the joining material of the present invention, it is preferred that a proportion of the second metal powder to a weight of the first metal powder be 5 wt % or less.

When a proportion of the second metal powder formed of a Cu—Ni alloy, a Cu—Ni—Co alloy, or a Cu—Ni—Fe alloy exceeds 5 wt %, a proportion of Sn or an alloy containing Sn to be liquidized and flow at the time of heating is relatively decreased, and as a result, a fluidity of the joining material tends to lower.

In the joining material of the present invention, it is preferred that D90 of the second metal powder be 4 μm or less.

When D90 of the second metal powder exceeds 4 μm, a large intermetallic compound is formed in a joining material, and as a result, a fluidity of the joining material tends to lower.

The method of manufacturing a joined body of the present invention includes arranging the joining material of the present invention between a first member and a second member, and heating the joining material arranged between the first member and the second member to join the first member and the second member to each other.

As described above, by using the joining material of the present invention, it is possible to suppress a generation of a crack after a solidification, and accordingly, it is possible to manufacture a joined body having an excellent joining reliability.

In the method of manufacturing a joined body of the present invention, it is preferred that the first member be an electrode of an electronic component, the second member be an electrode on a substrate, and the electronic component is mounted on the substrate.

According to the present invention, it is possible to provide a joining material capable of suppressing a crack which is generated in a joined portion after a solidification, and a method of manufacturing a joined body in which the joining material is used.

DETAILED DESCRIPTION OF THE INVENTION

Hereinbelow, a joining material and a method of manufacturing a joined body of the present invention will be described.

However, the present invention is not limited to the following structure, but may be used with an appropriate change within a scope where a gist of the present invention is not changed.

Incidentally, the present invention also includes a combination of two or more of desirable structures of the present invention which will be described below.

[Joining Material]

A joining material of the present invention contains a first metal powder and a second metal powder having a higher melting point than the first metal powder. The first metal powder is formed of Sn or an alloy containing Sn, and the second metal powder is formed of a Cu—Ni alloy, a Cu—Ni—Co alloy, or a Cu—Ni—Fe alloy.

Figure 1A:
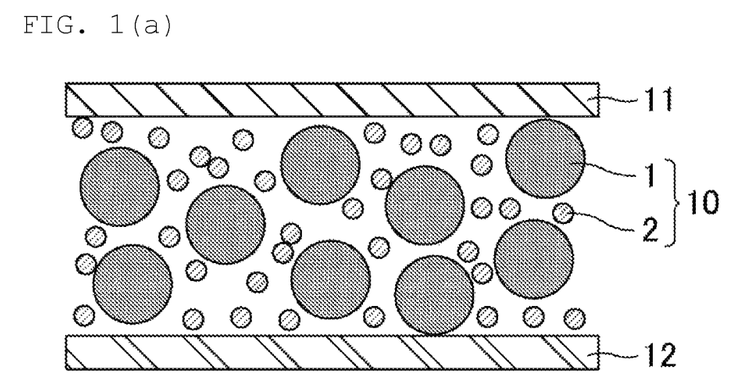
FIG. 1(a), FIG. 1(b), and FIG. 1(c) are views schematically showing actions, when a joining is conducted by using the joining material of the present invention.
Figure 1B:
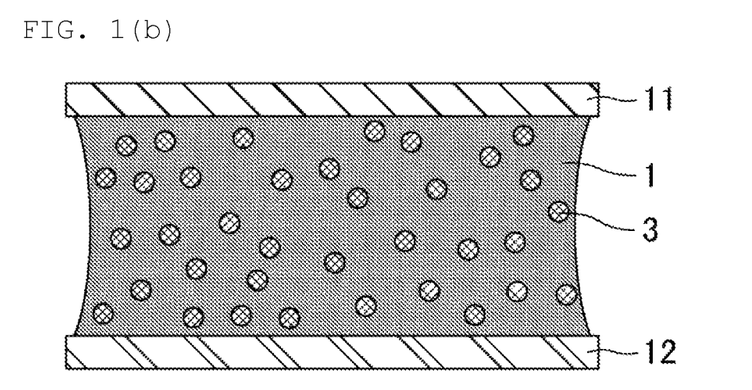
Figure 1C:
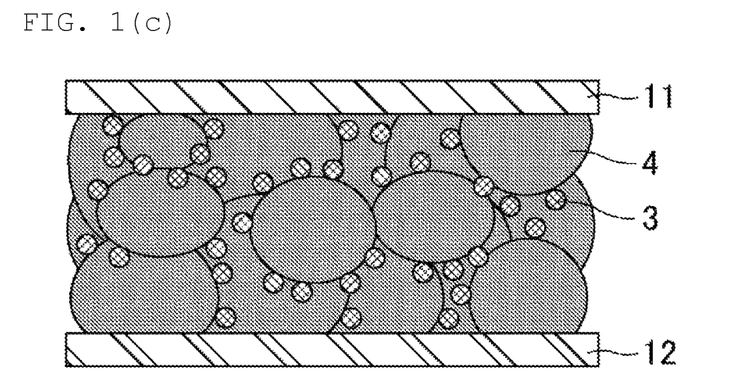

FIG. 1(a), FIG. 1(b), and FIG. 1(c) are views schematically showing actions, when a joining is conducted by using the joining material of the present invention.

First, as shown in FIG. 1(a), a joining material 10 containing a first metal powder 1 and a second metal powder 2 is arranged between a first member (e.g., an electrode) 11 and a second member (e.g., an electrode) 12.

Next, a heating is performed in this state, and when a temperature of the joining material 10 reaches a temperature equal to or higher than a melting point of a first metal (Sn or an alloy containing Sn), the first metal is melted. When the heating is further continued, the first metal and a second metal (a Cu—Ni alloy, a Cu—Ni—Co alloy, or a Cu—Ni—Fe alloy) react with each other to produce an intermetallic compound 3, as shown in FIG. 1(b).

Then, when the joining material is cooled and solidified, the joining material is brought into a state that the intermetallic compound 3 is dispersed among crystal grains 4 derived from the first metal such as Sn crystal grains, as shown in FIG. 1(c).

It is considered that, this intermetallic compound 3 suppresses an enlargement of the crystal grains 4, and as a result, a generation of crack after a solidification is suppressed.

In the joining material of the present invention, the first metal is Sn or an alloy containing Sn, and examples thereof may include Sn as a single component, and alloys containing Sn and at least one kind selected from the group consisting of Cu, Ni, Ag, Au, Sb, Zn, Bi, In, Ge, Al, Co, Mn, Fe, Cr, Mg, Mn, Pd, Si, Sr, Te, and P. Among those, Sn, Sn-3Ag-0.5Cu, Sn-3.5Ag, Sn-0.75Cu, Sn-58Bi, Sn-0.7Cu-0.05Ni, Sn-5Sb, Sn-2Ag-0.5Cu-2Bi, Sn-57Bi-1Ag, Sn-3.5Ag-0.5Bi-8In, Sn-9Zn, or Sn-8Zn-3Bi are preferred.

In the description, for example, "Sn-3Ag-0.5Cu" indicates an alloy containing 3 wt % of Ag, 0.5 wt % of Cu, and Sn as the reminder.

In the joining material of the present invention, an average grain size of the first metal powder is not particularly limited, but preferably 1 µm or more, and preferably 20 µm or less.

An average grain size refers to a grain size at a cumulative degree 50%, in a volume cumulative grain size distribution curve. More specifically, in a graph which plots grain size on the horizontal axis, and cumulative frequency from the small diameter side on the vertical axis (a volume-based grain size distribution), an average grain size (D50) corresponds to a grain size when cumulative value in terms of volume % amounts to 50% from the small diameter side with respect to a cumulative value of total grains (100%). D50 can be measured, for example, by using a laser diffraction/scattering grain size distribution measurement device (MT3300-EX manufactured by MicrotracBEL Corp.)

In the joining material of the present invention, the second metal is a Cu—Ni alloy in which proportion of Ni is 5 wt % to 30 wt %, or a Cu—Ni—Co alloy or a Cu—Ni—Fe alloy which contains Co or Fe as a third component of the Cu—Ni alloy, in which a total of a proportion of Ni and Co or Ni and Fe is 5 wt % to 30 wt %, and examples thereof may include Cu-5Ni, Cu-10Ni, Cu-15Ni, Cu-20Ni, Cu-25Ni, Cu-30Ni, Cu-4Ni-1Co, Cu-4Ni-4Co, Cu-20Ni-10Co, or Cu-4Ni-3Fe alloys.

In the description, for example, "Cu-5Ni" indicates an alloy containing 5 wt % of Ni, and Cu as the reminder.

In the joining material of the present invention, 90% volume grain size D90 of the second metal powder is 0.1 µm or more, preferably 0.5 µm or more, and more preferably 1 µm or more. D90 of the second metal powder is also preferably 4 µm or less, and more preferably 3 µm or less.

90% volume grain size D90 refers to a grain size at a cumulative degree 90%, in a volume cumulative grain size distribution curve. More specifically, in a graph which plots grain size on the horizontal axis, and cumulative frequency from the small diameter side on the vertical axis (a volume-based grain size distribution), D90 corresponds to a grain size when cumulative value in terms of volume % from the small diameter side amounts to 90% with respect to a cumulative value of total grains (100%). D90 can be measured, for example, by using a laser diffraction/scattering grain size distribution measurement device (MT3300-EX manufactured by MicrotracBEL Corp.)

In the joining material of the present invention, proportion of the second metal powder relative to a weight of the first metal powder is not particularly limited, but preferably 5 wt % or less, more preferably 4 wt % or less, and also preferably 0.5 wt % or more, more preferably 1 wt % or more.

The joining material of the present invention preferably contains a flux. In this case, the joining material of the present invention is capable of being used as a so-called solder paste.

A flux has a function of removing an oxide film on a surface of an object to be joined or of a metal. Those capable of being used as a flux are publicly known various substances formed of, for example, a vehicle, a solvent, a thixotropic agent, an activator, etc.

Specific examples of the vehicle may include rosin-based resins formed of a derivative such as rosin and a modified rosin obtained by modifying a rosin, synthetic resins, and mixtures thereof.

Specific examples of the rosin-based resins formed of derivatives such as rosin and a modified rosin obtained by modifying a rosin may include gum rosins, tall rosins, wood rosins, polymerized rosins, hydrogenated rosins, formylated rosins, rosin esters, rosin-modified maleic acid resins, rosin modified phenolic resins, rosin modified alkyd resins, and other various rosin derivatives, etc.

Specific examples of the synthetic resins formed of a derivative such as rosin and a modified rosin obtained by modifying rosin may include polyester resins, polyamide resins, phenoxy resins, terpene resins, etc.

Those known as the solvent are alcohols, ketones, esters, ethers, aromatic series, hydrocarbons, and specific examples thereof may include benzyl alcohol, ethanol, isopropyl alcohol, butanol, tetraethylene glycol, diethylene glycol, ethylene glycol, glycerin, ethyl cellosolve, butyl cellosolve, ethyl acetate, butyl acetate, benzoic acid butyl, diethyl adipate, dodecane, tetradecene, α-terpineol, terpineol, 2-methyl 2,4-pentanediol, 2-ethyl hexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexane dimethanol, 2-terpinyloxy ethanol, 2-dihydroterpinyloxy ethanol, and mixtures thereof.

Specific examples of the thixotropic agents may include hydrogenated castor oil, carnauba wax, amides, hydroxy fatty acids, dibenzylidene sorbitol, bis(p-methylbenzylidene)sorbitols, beeswax, stearamide, hydroxystearic acid ethylene bisamide, etc. As necessary, the above may also be used as a thixotropic agent also with an addition of a fatty acid such as caprylic acid, lauric acid, myristic acid, palmitic acid, stearic acid, behenic acid, a hydroxy fatty acid such as 1,2-hydroxy stearic acid, an antioxidant, a surfactant, amines, etc.

Those to be listed as the activator are hydrohalogenic acid salts of amine, organohalogen compounds, organic acids, organic amines, polyhydric alcohols, etc.

Specific examples of the hydrohalogenic acid salts of amine may include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrocloride, triethanolamine hydrobromide, monoethanolamine hydrobromide, etc.

Specific examples of the organohalogen compounds may include chlorinated paraffins, tetrabromoethane, dibromopropanol, 2,3-dibromo-1,4-butanediol, 2,3-dibromo-2-butene-1,4-diol, tris(2,3-dibromopropyl) isocyanurate, etc.

Specific examples of the organic acids may include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, dodecanoic acid, etc.

Specific examples of the organic amines may include monoethanolamine, diethanolamine, triethanolamine, tributylamine, aniline, diethylaniline, etc.

Specific examples of the polyhydric alcohols may include erythritol, pyrogallol, ribitol, etc.

As the flux, it is also possible to use those containing at least one kind selected from the thermosetting resin group consisting of epoxy resins, phenolic resins, polyimide resins, silicone resins or modified resins thereof, and acrylic resins; or at least one kind selected from the thermoplastic resin group consisting of polyamide resins, polystyrene resins, polymethacrylic resins, polycarbonate resins, and cellulose-based resins.

As described above, the joining material of the present invention preferably contains a flux, since a flux has a function of removing an oxide film on a surface of an object to be joined or of a metal. Content of flux is preferably 7 wt % to 15 wt % relative to a total weight of the joining material.

The joining material of the present invention does not necessarily contain a flux, and may also be applied to a joining method which does not need a flux. For example, it is also possible to manufacture a highly reliable joined body by removing an oxide film on a surface of an object to be joined or of a metal, by a method of heating with applying a pressure, a method of heating in a strong reducing atmosphere, or the like.

[Method of Manufacturing Joined Body]

The method of manufacturing a joined body of the present invention includes an arrangement step in which the joining material described in [Joining material] is arranged between a first member and a second member, and a heating step in which the joining material arranged between the first member and the second member is heated. By heating the joining material, a first metal and a second metal contained in the joining material are reacted with each other to form an intermetallic compound, and the first member and the second member are joined to each other through a joining portion containing this intermetallic compound.

In the method of manufacturing a joined body of the present invention, it is preferred that the first member be an electrode of an electronic component (e.g., a semi-conductor chip), and the second member be an electrode on a substrate, and an electronic device in which the electronic component is mounted on the substrate be manufactured. The method of manufacturing a joined body of the present invention is particularly suitable for manufacturing a semi-conductor device of a type in which a chip is die-bonded.

Figure 2A:
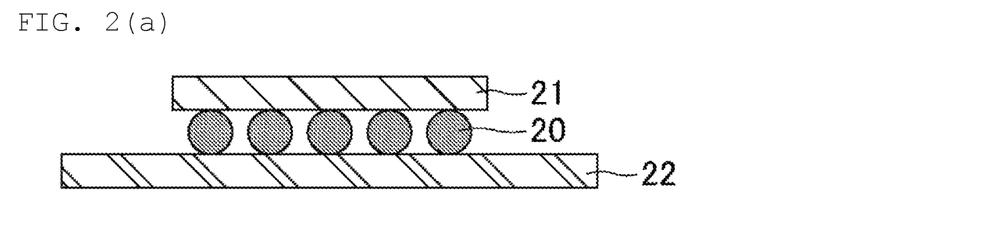
FIG. 2(a), FIG. 2(b), and FIG. 2(c) are views schematically showing an example of method of manufacturing an electronic device with an electronic component mounted on a substrate.
Figure 2B:
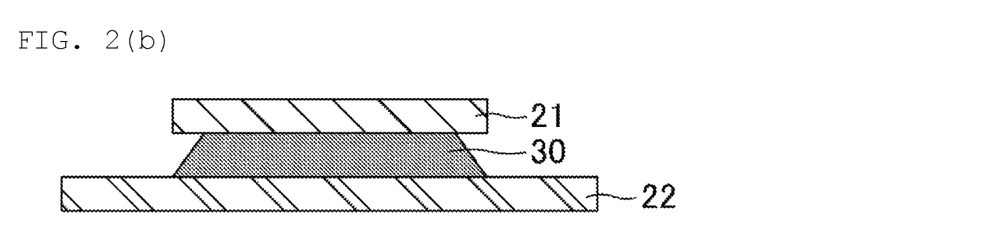
Figure 2C:
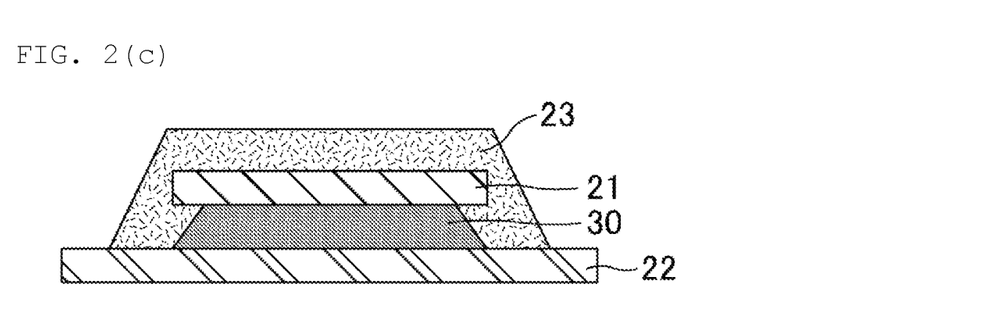

FIG. 2(a), FIG. 2(b), and FIG. 2(c) are views schematically showing an example of the method of manufacturing an electronic device in which an electronic component is mounted on a substrate.

In FIG. 2(a), FIG. 2(b), and FIG. 2(c), an electrode of the electronic component and an electrode on the substrate are omitted.

First, as shown in FIG. 2(a), joining material 20 of the present invention is arranged between an electronic component (e.g., a semi-conductor chip) 21 and a substrate 22.

Next, a heating is performed in this state, to form an intermetallic compound of the first metal and the second metal contained in the joining material, as shown in FIG. 2(b), and the electronic component 21 is die-bonded to the substrate 22 with a joining portion 30 containing this intermetallic compound interposed therebetween.

Thereafter, the electronic component 21 is molded by a resin 23, as shown in FIG. 2(c).

Although not shown in FIG. 2(c), it is preferred that the electronic component 21 be connected to a terminal of the substrate 22 by a wire bonding or the like, prior to the molding by the resin 23.

In the method of manufacturing a joined body of the present invention, in a case where the first member is an electrode of an electronic component, and the second member is an electrode on a substrate, it is preferred that each electrode be formed of Cu, Sn, or an alloy containing Cu or Sn. In this case, it is also possible that a plating layer formed of the metal or the alloy is formed on the surface of the electrodes. Although it is preferred that the plating layer be formed on an uppermost surface of the electrodes, it is also possible to form another layer such as a noble metal layer on the uppermost surface.

Incidentally, in the method of manufacturing a joined body of the present invention, the first member and the second member are not limited to electrodes. For example, it is possible that the first member is a metal wire of Cu or the like, and the second member is an electrode on a substrate, an electrode of an electronic component, or the like. The method of manufacturing a joined body of the present invention is also capable of manufacturing a joined body for those other than electronic devices.

EXAMPLES

Hereinbelow, Examples which disclose the present invention more concretely will be shown. However, the present invention is not limited only to the Examples.
[Production of Joining Material]

Example 1

In Example 1, a joining material paste was produced by mixing a first metal powder, a second metal powder, and a flux together.

As the first metal powder, Sn powder was used. Average grain size of the first metal powder was set to 20 μm.

As the second metal powder, a Cu-10Ni powder was used. A proportion of the second metal powder to a weight of the first metal powder was set to 1 wt %, and D90 of the second metal powder was set to 2 μm. The second metal powder used herein was produced in such a manner that a powder with a grain size of 5 μm or more and 15 μm or less which was produced by an atomizing method was micronized with a super high pressure wet pulverizer.

The flux used herein had the following blend percentages: rosin: 74 wt %, diethylene glycol monobutyl ether: 22 wt %, triethanolamine: 2 wt %, and hydrogenated castor oil: 2 wt %. Proportion in the total paste occupied by the flux was set to 10 wt %.

Example 2

A joining material paste was produced similarly as in Example 1, except that the proportion of the second metal powder to a weight of the first metal powder was changed to 2 wt %.

Example 3

A joining material paste was produced similarly as in Example 1, except that the proportion of the second metal powder to a weight of the first metal powder was changed to 5 wt %.

Example 4

A joining material paste was produced similarly as in Example 1, except that the proportion of the second metal powder to a weight of the first metal powder was changed to 6 wt %.

Comparative Example 1

A joining material paste was produced similarly as in Example 1, except that the proportion of the second metal powder to a weight of the first metal powder was changed to 3 wt %, and D90 of the second metal powder was changed to 0.05 μm.

Example 5

A joining material paste was produced similarly as in Example 1, except that the proportion of the second metal powder to a weight of the first metal powder was changed to 3 wt %, and D90 of the second metal powder was changed to 0.1 μm.

Example 6

A joining material paste was produced similarly as in Example 1, except that the proportion of the second metal powder to a weight of the first metal powder was changed to 3 wt %.

Example 7

A joining material paste was produced similarly as in Example 1, except that the proportion of the second metal powder to a weight of the first metal powder was changed to 3 wt %, and D90 of the second metal powder was changed to 4 μm.

Example 8

A joining material paste was produced similarly as in Example 1, except that the proportion of the second metal powder to a weight of the first metal powder was changed to 3 wt %, and D90 of the second metal powder was changed to 6 μm.

Comparative Example 2

A joining material paste was produced similarly as in Example 1, except that a Cu powder was used as the second metal powder, the proportion of the second metal powder to a weight of the first metal powder was changed to 3 wt %, and D90 of the second metal powder was changed to 4 μm.

Example 9

A joining material paste was produced similarly as in Example 1, except that a Cu-5Ni powder was used as the second metal powder, the proportion of the second metal powder to a weight of the first metal powder was changed to 3 wt %, and D90 of the second metal powder was changed to 4 μm.

Example 10

A joining material paste was produced similarly as in Example 1, except that a Cu-20Ni powder was used as the second metal powder, the proportion of the second metal powder to a weight of the first metal powder was changed to 3 wt %, and D90 of the second metal powder was changed to 4 μm.

Example 11

A joining material paste was produced similarly as in Example 1, except that a Cu-30Ni powder was used as the second metal powder, the proportion of the second metal powder to a weight of the first metal powder was changed to 3 wt %, and D90 of the second metal powder was changed to 4 μm.

Comparative Example 3

A joining material paste was produced similarly as in Example 1, except that a Cu-40Ni powder was used as the second metal powder, the proportion of the second metal powder to a weight of the first metal powder was changed to 3 wt %, and D90 of the second metal powder was changed to 4 μm.

Comparative Example 4

A joining material paste was produced similarly as in Example 1, except that a Ni powder was used as the second metal powder, the proportion of the second metal powder to a weight of the first metal powder was changed to 3 wt %, and D90 of the second metal powder was changed to 4 μm.

Example 12

A joining material paste was produced similarly as in Example 1, except that a Cu-4Ni-1Co powder was used as the second metal powder, the proportion of the second metal powder to a weight of the first metal powder was changed to 3 wt %, and D90 of the second metal powder was changed to 4 μm.

Example 13

A joining material paste was produced similarly as in Example 1, except that a Cu-4Ni-4Co powder was used as the second metal powder, the proportion of the second metal powder to a weight of the first metal powder was changed to 3 wt %, and D90 of the second metal powder was changed to 4 μm.

Example 14

A joining material paste was produced similarly as in Example 1, except that a Cu-20Ni-10Co powder was used as the second metal powder, the proportion of the second metal powder to a weight of the first metal powder was changed to 3 wt %, and D90 of the second metal powder was changed to 4 μm.

Example 15

A joining material paste was produced similarly as in Example 1, except that a Cu-4Ni-3Fe powder was used as the second metal powder, the proportion of the second metal powder to a weight of the first metal powder was changed to 3 wt %, and D90 of the second metal powder was changed to 4 μm.

Comparative Example 5

A joining material paste was produced similarly as in Example 1, except that a Cu-4Ni powder was used as the second metal powder, the proportion of the second metal powder to a weight of the first metal powder was changed to 3 wt %, and D90 of the second metal powder was changed to 4 μm.

[Evaluation of Joining Material]

The joining material pastes of Examples 1 to 15 and Comparative Examples 1 to 5 were evaluated for fluidity and crack suppressing effect, by the following method.

(Fluidity)

A glass epoxy substrate having a plural number of Cu electrode patterns formed on the surface (a circuit board) was prepared, and the surfaces of the Cu electrode patterns on the glass epoxy substrate were electrolytically plated. A piece of the Cu electrode patterns had a rectangular shape of 0.8 mm in X-direction (a horizontal direction) and 1.5 mm in Y-direction (a vertical direction). Provided that a single pair of Cu electrodes was consisting of two Cu electrode patterns arranged in X-direction (a horizontal direction) with an interval of 0.8 mm, 10 pairs of this Cu electrode pair were arranged each in X-direction with intervals of 1.9 mm, and in Y-direction with intervals of 2.9 mm. The prepared Cu electrode patterns were 200 pieces. That is, 100 pairs of Cu electrode pair were prepared.

Subsequently, the joining material pastes of Examples 1 to 15 and Comparative Examples 1 to 5 were applied, by printing, to portions for mounting of the substrate. By using an automatic chip mounting device, 100 pieces per substrate of a multilayer ceramic capacitor 2012 size (2.0 mm×1.2 mm×1.2 mm, see JEITA standard, or the like) were put on the portions, and then preheated at 130° C. or more and 180° C. or less for 70 seconds, and a mounting was conducted under general reflow conditions of 220° C. or higher for 30 seconds, and peak temperature of 245° C.

Evaluation of fluidity was conducted by evaluating self-alignment property of five substrates, namely, 500 pieces of chips. After the reflow, those which had 20 pieces or more deviated in X-direction or Y-direction by 0.2 mm or more, or had L direction of the chip inclined from X-direction of the substrate by 5° or more were evaluated as No Good (x), those which had 10 or more and less than 20 of such pieces were evaluated as Acceptable (○), and those which had less than 10 of such pieces were evaluated as Good (◎).

(Crack Suppressing Effect)

By using the joining material pastes of Examples 1 to 15 and Comparative Examples 1 to 5, a thermal shock test was conducted on the glass epoxy substrates mounting the multilayer ceramic capacitors. In the thermal shock test, each cycle which maintains temperature condition of −40° C. or 150° C. for 30 minutes was conducted 3000 times.

A joined portion of each sample after the thermal shock test was observed by an optical microscope or an electronic microscope to check whether or not a crack is present in the joined portion. The observation was conducted on 30 samples, and those in which no clear crack was observed in 29/30 or more samples were evaluated as Good (◎), those in which the proportion was 27/30 or more were evaluated as Acceptable (○), and those in which the proportion was 26/30 or less were evaluated as No Good (x).

(Judgement)

In the evaluations of fluidity and crack suppressing effect, among those with a crack suppressing effect evaluated as Good (◎), those with fluidity evaluated as Good (◎) or Acceptable (○) were judged as Pass (◎); among those with a crack suppressing effect evaluated as Good (◎), those with a fluidity evaluated as No Good (x) were judged as Pass (○); those with a crack suppressing effect evaluated as Acceptable (○) were judged as Pass (○) irrespective of evaluation of a fluidity; and those with a crack suppressing effect evaluated as No Good (x) were judged as Fail (x) irrespective of evaluation of a fluidity. Results are shown in Table 1.

TABLE 1

| | Second metal powder | | | | Crack | |
|---|---|---|---|---|---|---|
| | Kind | Proportion [wt %] | D90 [μm] | Fluidity | suppressing effect | Judgement |
| Example 1 | Cu—10Ni | 1 | 2 | ◎ | ○ | ○ |
| Example 2 | Cu—10Ni | 2 | 2 | ◎ | ◎ | ◎ |
| Example 3 | Cu—10Ni | 5 | 2 | ○ | ◎ | ◎ |
| Example 4 | Cu—10Ni | 6 | 2 | X | ◎ | ○ |
| Comparative Example 1 | Cu—10Ni | 3 | 0.05 | ◎ | X | X |
| Example 5 | Cu—10Ni | 3 | 0.1 | ◎ | ○ | ○ |
| Example 6 | Cu—10Ni | 3 | 2 | ◎ | ◎ | ◎ |
| Example 7 | Cu—10Ni | 3 | 4 | ◎ | ◎ | ◎ |
| Example 8 | Cu—10Ni | 3 | 6 | X | ◎ | ○ |
| Comparative Example 2 | Cu | 3 | 4 | ◎ | X | X |
| Example 9 | Cu—5Ni | 3 | 4 | ◎ | ◎ | ◎ |
| Example 10 | Cu—20Ni | 3 | 4 | ◎ | ○ | ○ |
| Example 11 | Cu—30Ni | 3 | 4 | ◎ | ○ | ○ |
| Comparative Example 3 | Cu—40Ni | 3 | 4 | ◎ | X | X |
| Comparative Example 4 | Ni | 3 | 4 | ◎ | X | X |
| Example 12 | Cu—4Ni—1Co | 3 | 4 | ◎ | ◎ | ◎ |
| Example 13 | Cu—4Ni—4Co | 3 | 4 | ◎ | ◎ | ◎ |
| Example 14 | Cu—20Ni—10Co | 3 | 4 | ◎ | ○ | ○ |
| Example 15 | Cu—4Ni—3Fe | 3 | 4 | ◎ | ◎ | ◎ |
| Comparative Example 5 | Cu—4Ni | 3 | 4 | ◎ | X | X |

From Table 1, it was confirmed that proportion of crack generated in the joined portion was small in Examples 1 to 11 which used a powder of a Cu—Ni alloy in which proportion of Ni is 5 wt % or more and 30 wt % or less, and D90 is 0.1 μm or more as the second metal powder, and Examples 12 to 15 which used a powder of a Cu—Ni—Co alloy or a Cu—Ni—Fe alloy in which a total of a proportion of Ni and Co or Ni and Fe is 5 wt % or more and 30 wt % or less, and D90 is 0.1 μm or more as the second metal powder.

It was confirmed that, when the second metal powder had equal D90, a fluidity of the joining material was superior in Examples 1 to 3 and Example 6 in which a proportion of the second metal powder to a weight of the first metal powder was 5 wt % or less, as compared to Example 4 in which the proportion exceeded 5 wt %.

It was confirmed that, when a proportion of the second metal powder to a weight of the first metal powder was equal, a fluidity of the joining material was superior in Examples 5 to 7 in which D90 of the second metal powder was 4 μm or less, as compared to Example 8 in which D90 of the second metal powder exceeded 4 μm.

On the other hand, it was confirmed that proportion of occurrence of crack in the joined portion was large in Comparative Example 1 in which D90 of the second metal powder was less than 0.1 μm, Comparative Example 2 in which a Cu powder was used as the second metal powder, Comparative Example 3 in which proportion of Ni exceeded 30 wt %, Comparative Example 4 in which a Ni powder was used as the second metal powder, and Comparative Example 5 in which proportion of Ni was less than 5 wt % as the second metal powder.

In Comparative Example 1, this is considered to be because, since the second metal powder is extremely fine particles, an intermetallic compound formed through a reaction with the first metal powder is also fine particles, which encourages an enlargement of Sn crystal grains, and as a result, development of crack cannot be inhibited.

In Comparative Examples 2, 3, 4, and 5, this is considered to be because, since reaction of Cu, Cu-40Ni alloy, Ni, and Cu-4Ni with Sn proceeds very slow, little intermetallic compound is formed, which encourages an enlargement of Sn crystal grains, and as a result, development of crack cannot be inhibited.

DESCRIPTION OF REFERENCE SYMBOLS

1: First metal powder
2: Second metal powder
3: Intermetallic compound
4: Crystal grains
10: Joining material
11: First member (Electrode)
12: Second member (Electrode)
20: Joining material
21: Electronic component (Semi-conductor chip)
22: Substrate
23: Resin
30: Joined portion

The invention claimed is:
1. A joining material comprising:
a first metal powder including Sn or an alloy containing Sn; and
a second metal powder having a higher melting point than the first metal powder, the second metal powder including
a Cu—Ni alloy in which a proportion of Ni is 5 wt % to 30 wt %,
a Cu—NiCo alloy in which a total of a proportion of Ni and a proportion of Co is 5 wt % to 30 wt %, or
a Cu—NiFe alloy in which a total of a proportion of Ni and a proportion of Fe is 5 wt % to 30 wt %, and
a 90% volume grain size D90 of the second metal powder is 0.1 μm to 4 μm, and
a proportion of a weight of the second metal powder to a weight of the first metal powder is 0.05 or less.

2. The joining material according to claim 1, wherein a proportion of a weight of the second metal powder to a weight of the first metal powder is 0.005 to 0.05.

3. The joining material according to claim 1, wherein a proportion of a weight of the second metal powder to a weight of the first metal powder is 0.01 to 0.04.

4. The joining material according to claim 1, wherein the alloy containing Sn includes at least of Cu, Ni, Ag, Au, Sb, Zn, Bi, In, Ge, Al, Co, Mn, Fe, Cr, Mg, Mn, Pd, Si, Sr, Te, or P.

5. The joining material according to claim 1, wherein an average grain size of the first metal powder is 1 μm to 20 μm.

6. The joining material according to claim 1, wherein the 90% volume grain size D90 of the second metal powder is 0.5 μm to 3 μm.

7. The joining material according to claim 1, wherein the joining material further contains a flux.

8. The joining material according to claim 7, wherein a content of the flux is 7 wt % to 15 wt % to a total weight of the joining material.

9. A method of manufacturing a joined body, the method comprising:
arranging a joining material between a first member and a second member, the joining material comprising:
a first metal powder including Sn or an alloy containing Sn; and
a second metal powder having a higher melting point than the first metal powder, the second metal powder including
a Cu—Ni alloy in which a proportion of Ni is 5 wt % to 30 wt %,
a Cu—Ni—Co alloy in which a total of a proportion of Ni and a proportion of Co is 5 wt % to 30 wt %, or
a Cu—Ni—Fe alloy in which a total of a proportion of Ni and a proportion of Fe is 5 wt % to 30 wt %, and
a 90% volume grain size D90 of the second metal powder is 0.1 μm to 4 μm, and
a proportion of a weight of the second metal powder to a weight of the first metal powder is 0.05 or less; and
heating the joining material arranged between the first member and the second member to join the first member and the second member to each other.

10. The method of manufacturing a joined body according to claim 9, wherein the first member is an electrode of an electronic component, the second member is an electrode on a substrate, and the electronic component is mounted on the substrate.

11. The method of manufacturing a joined body according to claim 9, wherein a proportion of a weight of the second metal powder to a weight of the first metal powder is 0.005 to 0.05.

12. The method of manufacturing a joined body according to claim 9, wherein a proportion of a weight of the second metal powder to a weight of the first metal powder is 0.01 to 0.04.

13. The method of manufacturing a joined body according to claim 9, wherein an average grain size of the first metal powder is 1 μm to 20 μm.

14. The method of manufacturing a joined body according to claim 9, wherein the 90% volume grain size D90 of the second metal powder is 0.5 μm to 3 μm.

* * * * *